United States Patent
Kong et al.

(10) Patent No.: US 6,442,061 B1
(45) Date of Patent: Aug. 27, 2002

(54) SINGLE CHANNEL FOUR TRANSISTOR SRAM

(75) Inventors: Weiran Kong, Sunnyvale; Gary K. Giust, Cupertino; Ramnath Venkatraman, San Jose; Yauh-Ching Liu; Franklin Duan, both of Sunnyvale; Ruggero Castagnetti, Menlo Park, all of CA (US); Steven M. Peterson, Eagan; Myron J. Buer, Shakopee, both of MN (US); Minh Tien Nguyen, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/783,653

(22) Filed: Feb. 14, 2001

(51) Int. Cl.[7] .............................................. G11C 11/00
(52) U.S. Cl. ..................... 365/154; 365/188; 365/156
(58) Field of Search ................................ 365/154, 188, 365/156

(56) References Cited

U.S. PATENT DOCUMENTS

| | | | | |
|---|---|---|---|---|
| 5,068,825 A | * | 11/1991 | Mahant-Shetti et al. | 365/154 |
| 5,640,342 A | * | 6/1997 | Gonzalez | 365/156 |
| 5,881,010 A | * | 3/1999 | Artieri | 365/222 |
| 6,172,899 B1 | * | 1/2001 | Marr et al. | 365/154 |
| 6,285,578 B1 | * | 9/2001 | Huang | 365/154 |
| 6,301,146 B1 | * | 10/2001 | Ang et al. | 365/154 |

OTHER PUBLICATIONS

Takeda et al., A 16Mb 400MHz Loadless CMOS Four–Transistor SRAM Macro, 2000 IEEE International Solid–State Circuits Conference, pp. 264–265 and supplement 212–213, IEEE, Feb. 8, 2000.

Noda et al., A 1.9–$\mu m^2$ Loadless CMOS Four–Transistor SRAM Cell in a 0.18–$\mu m$ Logic Technology, IEDM 98, pp. 643–646, IEEE, 1998.

Imai et al., CMOS device optimization for system–on–a–chip applications, IEEE, 2000.

(List continued on next page.)

Primary Examiner—Richard Elms
Assistant Examiner—Tuan T. Nguyen
(74) Attorney, Agent, or Firm—Luedeka, Neely & Graham

(57) ABSTRACT

A method of forming a memory cell according to the present invention. A first pass gate transistor is formed of a first transistor type. The first pass gate transistor has a gate oxide with a first thickness. The source of the first pass gate transistor is electrically connected to a first bit line, and the drain of the first pass gate transistor is electrically connected to a first state node. The gate of the first pass gate transistor is electrically connected to a memory cell enable line. A second pass gate transistor is also formed of the first transistor type. The second pass gate transistor also has a gate oxide with the first thickness. The source of the second pass gate transistor is electrically connected to a second bit line, and the drain of the second pass gate transistor is electrically connected to a second state node. The gate of the second pass gate transistor is electrically connected to the memory cell enable line. A first state node transistor is also formed of the first transistor type. The first state node transistor has a gate oxide with a second thickness. The source of the first state node transistor is electrically connected to the first state node, and the drain of the first state node transistor is electrically connected to a ground line. The gate of the first state node is electrically connected to the second state node. A second state node transistor is also formed of the first transistor type. The second state node transistor also has a gate oxide with the second thickness. The source of the second state node transistor is electrically connected to the second state node, and the drain of the second state node transistor is electrically connected to the ground line. The gate of the second state node is electrically connected to the first state node.

12 Claims, 2 Drawing Sheets

OTHER PUBLICATIONS

Noda et al., An Ultra–High–Density High–Speed Loadless Four–Transistor SRAM Macro with a Dual–Layered Twisted Bit–Line and a Triple–Well Shield, pp. 283–286, date unknown.

Takeda et al., A 16Mb 400MHz Loadless CMOS Four–Transistor SRAM Macro, IEEE Journal of Solid–State Circuits, vol. 35, No. 11, pp. 1631–1640, Nov. 2000.

* cited by examiner

SINGLE CHANNEL FOUR TRANSISTOR SRAM

FIELD

This invention relates to the field of integrated circuits. More particularly this invention relates to the field of reducing the size of monolithic, semiconductor static random access memory circuits.

BACKGROUND

Integrated circuit designers continually look for ways in which to reduce size of individual integrated circuits. By so doing, an additional number of integrated circuits may be formed in a given surface area of material. Thus, devices of the same size are able to increase in capacity, and typically do so with a decrease in cost, or at least a decrease in the cost per integrated circuit contained within the device.

Unfortunately, many structures within an integrated circuit are not easily reduced in size, or have already been reduced in size to a minimum practical limit given current technology. For example, the surface area of a substrate required for a six transistor CMOS memory cell has already been reduced to a significant degree. Current technology makes a further reduction in the size of a six transistor CMOS memory relatively difficult, to the point that any further reduction in size may come at the cost of increased expense of manufacture per memory cell, rather than enjoying a decreased expense of manufacture per memory cell.

What is needed therefore, is a smaller memory cell that can be fabricated using currently available processes and at relatively reduced expense.

SUMMARY

The above and other needs are provided by a method of forming a memory cell according to the present invention. A first pass gate transistor is formed of a first transistor type. The first pass gate transistor has a gate oxide with a first thickness. The source of the first pass gate transistor is electrically connected to a first bit line, and the drain of the first pass gate transistor is electrically connected to a first state node. The gate of the first pass gate transistor is electrically connected to a memory cell enable line.

A second pass gate transistor is also formed of the first transistor type. The second pass gate transistor also has a gate oxide with the first thickness. The source of the second pass gate transistor is electrically connected to a second bit line, and the drain of the second pass gate transistor is electrically connected to a second state node. The gate of the second pass gate transistor is electrically connected to the memory cell enable line.

A first state node transistor is also formed of the first transistor type. The first state node transistor has a gate oxide with a second thickness. The source of the first state node transistor is electrically connected to the first state node, and the drain of the first state node transistor is electrically connected to a ground line. The gate of the first state node is electrically connected to the second state node.

A second state node transistor is also formed of the first transistor type. The second state node transistor also has a gate oxide with the second thickness. The source of the second state node transistor is electrically connected to the second state node, and the drain of the second state node transistor is electrically connected to the ground line. The gate of the second state node is electrically connected to the first state node.

In various preferred embodiments, the first thickness of gate oxide is greater than the second thickness of gate oxide, and the first transistor type may be alternately NMOS or PMOS.

By having only four transistors in the memory cell instead of six, the size of the memory cell is reduced considerably. Further, but not having a separate load on the sources of the first state node transistor and the second state node transistor, the size of the memory cell is further reduced. Finally, by forming the first pass gate transistor and the second pass gate transistor with a different thickness of gate oxide, the first pass gate transistor and the second pass gate transistor can be formed with a leakage current that is much greater than the first state node transistor and the second state node transistor, which enables the memory cell to be formed of transistors that are all of the same type. In traditional memory cell architecture, either a load is preferably applied to the sources of the first state node transistor and the second state node transistor, or the first state node transistor and the second state node transistor are preferably formed of a different transistor type than the first pass gate transistor and the second pass gate transistor.

For example, typically when no load is provided, both the first state node transistor and the second state node transistor are formed as NMOS transistors and both the first pass gate transistor and the second pass gate transistor are formed as PMOS transistors. Alternately, both the first state node transistor and the second state node transistor are formed as PMOS transistors and both the first pass gate transistor and the second pass gate transistor are formed as NMOS transistors. In either configuration, isolation structures are typically required to isolate the PMOS transistors from the NMOS transistors. These isolation structures tend to require additional surface area in the substrate in which the memory cell is formed, and thus act to generally increase the resultant size of the memory cell. However, according to the present invention, traditional isolation structures are not required because the transistors may all be formed of the same transistor type, whether PMOS or NMOS. Thus, memory cells according to the present invention tend to require less surface area than memory cells in the prior art.

Additionally, by forming the first pass gate transistor and the second pass gate transistor with a greater thickness of gate oxide than the first state node transistor and the second state node transistor, the first pass gate transistor and the second pass gate transistor can selectively receive and pass a voltage potential that is greater than would otherwise be advisable for a thinner gate oxide device, and thus can store a commensurately greater voltage potential on the first state node and the second state node. Thus, the first state node and the second state node can store a full voltage potential according to the preferred voltage of the first state node transistor and the second state node transistor, rather than a voltage potential that is somewhat less than a full state voltage potential. This operational configuration further reduces any need for pull up transistors or loads.

In additional preferred embodiments, a single well contains all of the first pass gate transistor, the second pass gate transistor, the first state node transistor, and the second state node transistor. Most preferably, the leakage current of the first pass gate transistor and the second pass gate transistor is about one hundred times the leakage current of the first state node transistor and the second state node transistor. The thickness of the gate oxide for both the first pass gate transistor and the second pass gate transistor is preferably about sixty angstroms, with a channel length of about 0.24 microns, and a width of about 0.3 microns. It is appreciated

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
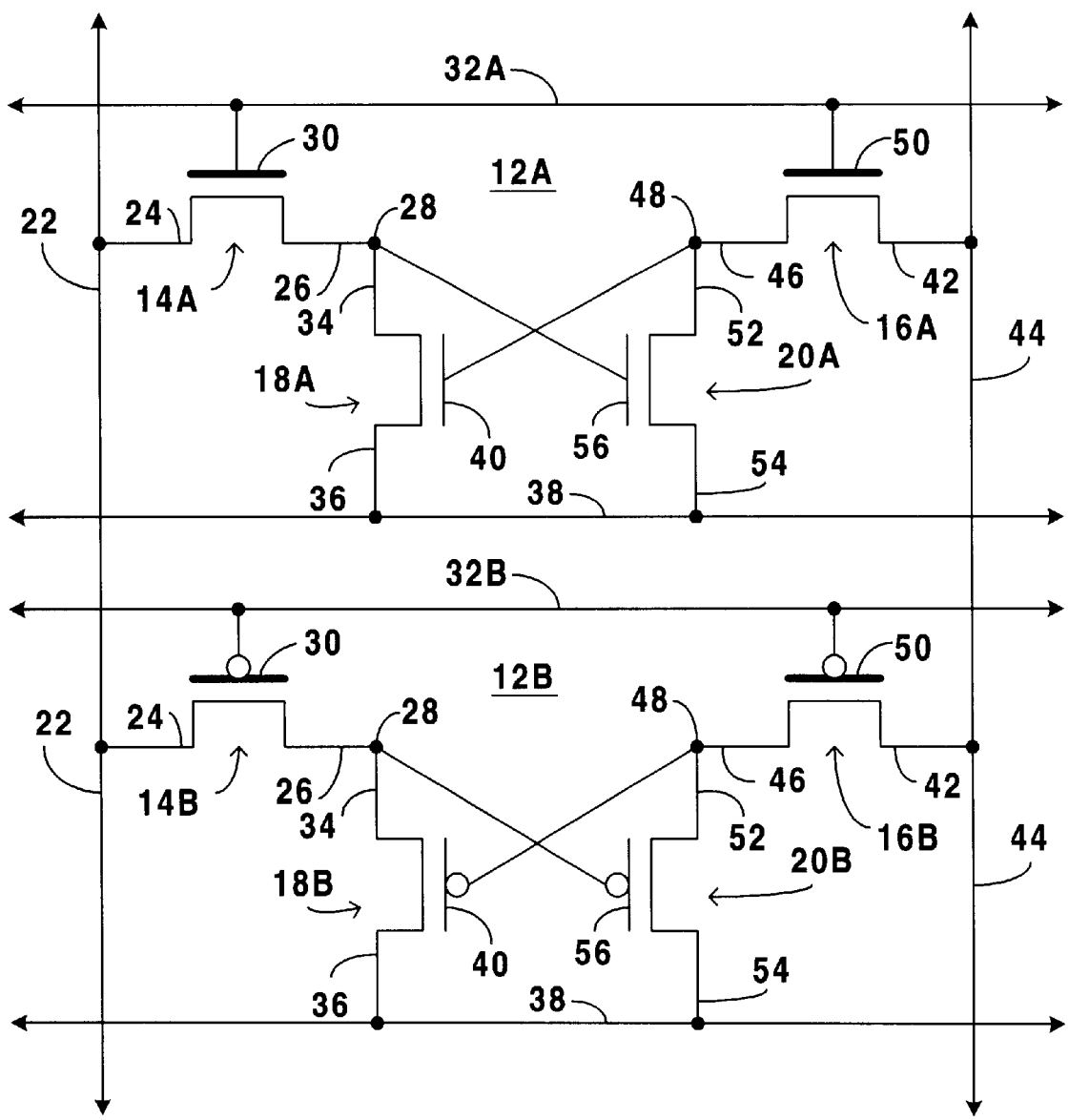
FIG. 1 is a circuit diagram of a memory circuit according to the present invention.

Referring now to FIG. 1 there is depicted a portion of a memory circuit 10, showing two memory cells 12A and 12B. Memory cells 12A and 12B are substantially similar except for the difference that memory cell 12A is based on an NMOS transistor type technology and memory cell 12B is based on a PMOS transistor type technology. Thus, with just a few exceptions, the descriptions provided for the memory cell 12A also apply to the memory cell 12B. However, in the most preferred embodiment, NMOS transistors are used.

The memory cell 12A is designed to store one of two different logic states, either a 0 or a 1, or in other words, either a logical low state or a logical high state. This is accomplished by applying one of two different voltage potentials to each of the first state node 28 and second state node 48. The two different voltage potentials that represent the logical low state and the logical high state may have different values depending upon certain factors, but are generally sufficiently different that other portions of the integrated circuit are able to distinguish between the two different voltage potentials.

The logic state of the memory cell 12A is typically determined by the relative logic states set at each of the first state node 28 and the second state node 48. For example, when the first state node 28 is at a logic 1 or high and the second state node 48 is at a logic 0 or low, then the memory cell 12A is typically considered to be storing a logic state 1, or in other words at a high value. Conversely, when the first state node 28 is at a logic 0 or low and the second state node 48 is at a logic 1 or high, then the memory cell 12A is typically considered to be storing a logic state 0 or in other words at a low value. It is appreciated that this convention may be altered, and is not an essential part of the invention.

The first bit line 22 and the second bit line 44 are operable to both read from and write to the memory cell 12A, while the memory cell enable line 32A is operable to enable the read and write operations. The first bit line 22 is electrically connected to the source 24 of a first pass gate transistor 14A, and the second bit line 44 is electrically connected to the source 42 of a second pass gate transistor 16A. The gate 30 of the first pass gate transistor 14A is electrically connected to the memory cell enable line 32A, and the gate 50 of the second pass gate transistor 16A is also electrically connected to the memory cell enable line 32A. Thus, when the memory cell enable line 32A is brought to a high value, or in other words a logical 1 the gates 30 and 50 of the NMOS transistors 14A and 16A are opened.

With the gate 30 open, the first pass gate transistor 14A passes a logical high potential on the first bit line 22 from the source 24 to the drain 26 and to the first state node 28. Similarly, with the gate 50 open, the second pass gate transistor 16A passes a logical high potential on the second bit line 44 from the source 42 to the drain 46 and to the second state node 48. Conversely, if there is a logical low potential on the first bit line 22 when the gate 30 of the first pass gate transistor 14A is opened, then the first state node 28 will now change its state from high to low, or remain low. In other words, when the gate 30 of the first pass gate transistor 14A is opened, then the first state node 28 will either change to or remain at the same state as is applied to the first bit line 22. Similarly, if there is a logical low potential on the second bit line 44 when the gate 50 of the second pass gate transistor 16A is opened, then the second state node 48 will now change its state from high to low, or remain low. In other words, when the gate 50 of the second pass gate transistor 16A is opened, then the second state node 48 will either change to or remain at the same state as is applied to the second bit line 44.

It is appreciated that the designation of the source 24 and drain 26 of the first pass gate transistor 14A, and the designation of the source 42 and the drain 46 of the second pass gate transistor 16A are respectively interchangeable, in that according to the voltage potentials applied to the first pass gate transistor 14A and the second pass gate transistor 16A, current may flow in either direction through either of the first pass gate transistor 14A and the second pass gate transistor 16A.

The first state node 28 is electrically connected to the source 34 of the first state node transistor 18A and also to the gate 56 of the second state node transistor 20A. Similarly, the second state node 48 is electrically connected to the source 52 of the second state node transistor 20A and also to the gate 40 of the first state node transistor 18A. Thus, when the first state node 28 is at a high voltage potential, the gate 56 of the second state node transistor 20A is open. When this condition is present, the second state node transistor 20A allows an isolated potential at the second state node 48 to be in electrical communication through the drain 54 and to the ground line 38. The ground line 38 is typically held at a logical zero or low voltage potential, such as Vss. Therefore, When the first state node 28 is at a high potential, the isolated second state node 48 is pulled down to a low potential by the ground line 38.

Similarly, when the second state node 48 is at a high voltage potential, the gate 40 of the first state node transistor 18A is open. When this condition is present, the first state node transistor 18A allows an isolated potential at the first state node 28 to be in electrical communication through the drain 36 to the ground line 38. Therefore, when the second state node 48 is at a high potential, the isolated first state node 28 is pulled down to a low potential by the ground line 38.

Conversely, when the first state node 28 is at a low voltage potential, the gate 56 of the second state node transistor 20A is closed. When this condition is present, the second state node transistor 20A isolates a high voltage potential at the second state node 48 from the drain 54 and the ground line 38. In like manner, when the second state node 48 is at a low voltage potential, the gate 40 of the first state node transistor 18A is closed. When this condition is present, the first state node transistor 18A isolates a high voltage potential at the first state node 28 from the drain 36 and the ground line 38.

To read the state of the memory cell 12A, both the first bit line 22 and the second bit line 44 are brought to a logical high voltage potential, and the memory cell enable line 32A is also brought to the logical high voltage potential, such as the $V_{DD}$ potential. The memory cell enable line 32A may also be called a word line. The memory cell enable line 32A, when brought to the high potential, turns on the gates 30 and 50 of the first pass gate transistor 14A and the second pass gate transistor 16A, as described above. Suppose, for the sake of this example of the read process, that the memory cell 12A is storing a logical zero, such that the first state node 28 is at a logical low voltage potential and the second state node 48 is at a logical high voltage potential. With the first state node 28 at a logical low voltage potential, the gate 56 of the second state node transistor 20A is closed, as described above, and with the second state node 48 at a logical high voltage potential, the gate 40 of the first state node transistor 18A is open, also as described above.

Thus, the logical high voltage potential on the first bit line 22 is electrically connected through the logical low voltage potential first state node 28 to the ground line 38, causing a drop of perhaps several hundred millivolts in the potential of the first bit line 22, depending upon the voltage potentials used in the circuit 10. However, the logical high voltage potential on the second bit line 44 is electrically connected only to the logical high voltage potential on the second state node 48 and not to the ground line 38, and thus the second bit line 44 does not experience the same reduction in voltage potential as the first bit line 22. The difference in potential between the first bit line 22 and the second bit line 44 can be determined, such as by a sensing amplifier (not shown), and thus the logical low state of the memory cell 12A can be determined from the first bit line 22 having a relatively lower potential than the second bit line 44.

Alternately, by way of opposite example, is the case of when the memory cell 12A is storing a logical one, such that the first state node 28 is at a logical high voltage potential and the second state node 48 is at a logical low voltage potential. With the first state node 28 at a logical high voltage potential, the gate 56 of the second state node transistor 20A is open, as described above, and with the second state node 48 at a logical low voltage potential, the gate 40 of the first state node transistor 18A is closed, also as described above.

Thus, the logical high voltage potential on the second bit line 44 is electrically connected through the logical low voltage potential second state node 48 to the ground line 38, causing a voltage drop in the potential of the second bit line 44, similar to that as described above. Again, however, the logical high voltage potential on the first bit line 22 is electrically connected only to the logical high voltage potential on the first state node 28 and not to the ground line 38, and thus the first bit line 22 does not experience the same reduction in voltage potential as the second bit line 44. The difference in potential between the first bit line 22 and the second bit line 44 is determined, and the logical state of the memory cell 12A is sensed from the first bit line 22 having a relatively higher potential than the second bit line 44. Therefore, to read the state of the memory cell 12A, all three of the memory cell enable line 32A, the first bit line 22, and the second bit line 44 are driven at a logical high voltage potential.

To write to the memory cell 12A, the memory cell enable line 32A is again driven to a logical high voltage potential, but only one of the first bit line 22 and the second bit line 44 are driven to the logical high voltage potential. If the first bit line 22 is driven to the logical high voltage potential and the second bit line 44 is pulled down to the logical low voltage potential, then a logical 1 is stored in the memory cell 12A, by driving the first state node 28 high and pulling the second state node 48 low. This is accomplished when the logical high voltage potential applied to the first state node 28 opens the gate 56 of the second state node transistor 20A, which electrically connects the second state node 48 to the ground line 38, pulling the second state node 48 to a logical low voltage potential.

Similarly, if the second bit line 44 is driven to the logical high voltage potential and the first bit line 22 is pulled down to the logical low voltage potential, then a logical 0 is stored in the memory cell 12A, by driving the second state node 48 high and pulling the first state node 28 low. This is accomplished when the logical high voltage potential applied to the second state node 48 opens the gate 40 of the first state node transistor 18A, which electrically connects the first state node 28 to the ground line 38, pulling the first state node 28 to a logical low voltage potential. Therefore, to write a state to the memory cell 12A, the memory cell enable line 32A is driven to a logical high voltage potential, and one but not both of the first bit line 22 and the second bit line 44 is also driven to a logical high voltage potential while the other of the first bit line 22 and the second bit line 44 is pulled down to a logical low voltage potential.

However, without additional considerations, the memory cell 12A as described above would tend to become unstable when left in a standby mode for a sufficient length of time, or in other words when it was not being read from or written to frequently enough. Some of the factors contributing to this instability are the leakage and offset currents from the first state node 28 and the second state node 48. In other words, the logical high voltage potentials that are written to one or the other of the first state node 28 and the second state node 48 tend to dissipate with time. It is for this reason that prior art designs incorporate either a load or a pull up transistor to maintain a logical high voltage potential on the appropriate one of either the first state node 28 or the second state node 48. Another reason for the load or pull up transistor is to get a full load onto the first state node 28 or the second state node 48. The present invention addresses this concern in a different manner, as described more completely elsewhere herein.

The problem of maintaining the logical high voltage potential state of the appropriate one of either the first state node 28 or the second state node 48 is overcome in the present invention by forming both the first pass gate transistor 14A and the second pass gate transistor 16A with leakage currents that are far in excess of the leakage current of the respective first state node transistor 18A and the second state node transistor 20A. Preferably, the leakage currents of the first pass gate transistor 14A and the second pass gate transistor 16A are about two orders or magnitude greater, or in other words about one hundred times greater than the leakage current of the respective first state node transistor 18A and the second state node transistor 20A. Although there are different methods for adjusting the leakage current of a transistor, in the preferred embodiment this is accomplished by adjusting the thickness of the transistor gate oxide, as described herein.

In this manner, the appropriate one of either the first state node 28 or the second state node 48 that is to be at a logical high voltage potential is almost continually refreshed by the relatively high leakage current from the respective first pass gate transistor 14A or the second pass gate transistor 16A, and thus is able to maintain it logical high voltage potential despite the problems mentioned above. On the other hand, the appropriate one of either the first state node 28 or the second state node 48 that is to be at a logical low voltage potential is continually depleted by the open electrical connection to the ground line 38. It is appreciated that at times one or the other of the first bit line 22 and the second bit line 44 will be pulled down to a logical low voltage potential so as to write to another of the memory cells in the memory circuit 10. However, these occasions tend to be of short enough duration that the appropriate one of either the first state node 28 or the second state node 48 is sufficiently replenished and does not become unstable.

Most preferably, the leakage of the first pass gate transistor 14A and the second pass gate transistor 16A is provided by forming the first pass gate transistor 14A and the second pass gate transistor 16A with thicker gate oxides and otherwise adjusting the size of the gates 30 and 50 to provide a higher leakage current through the first pass gate transistor 14A and the second pass gate transistor 16A. In a most preferred embodiment this is accomplished by increasing the thickness of the gate oxide from a standard thickness of between about five angstroms and about forty angstroms, and most preferably about twenty angstroms, to a greater thickness of between about twenty angstroms and about one hundred angstroms, and most preferably about sixty angstroms. It is appreciated that these numbers will preferably scale with other dimensions as the overall size of the memory cell 12A is generally reduced.

Also depicted in FIG. 1 is memory cell 12B, which is substantially similar to memory cell 12A in construction, except that the transistors of memory cell 12B are all formed using PMOS technology, rather than the NMOS technology used in the formation of the transistors of memory cell 12A. Thus, the operation of the memory cell 12B is somewhat similar to that as described above for memory cell 12A, except that applying a logical high voltage potential to the gates of the transistors of memory cell 12B has an opposite effect from that as described above for memory cell 12A. In other words, applying a logical high voltage potential to the gates of the transistors of memory cell 12B causes a PMOS gate that is normally open to close, while removing the logical high voltage potential from the gates of the transistors of memory cell 12B causes their PMOS gates to reopen.

Thus, memory cell 12B is read from and written to by dropping the voltage potential on the memory cell enable line 32B to a logical low, instead of raising the s voltage potential on the memory cell enable line 32A to a logical high, as was the case with memory cell 12A. Other differences in operation of the memory cell 12B are also apparent from the use of PMOS technology as opposed to NMOS technology.

Figure 2:
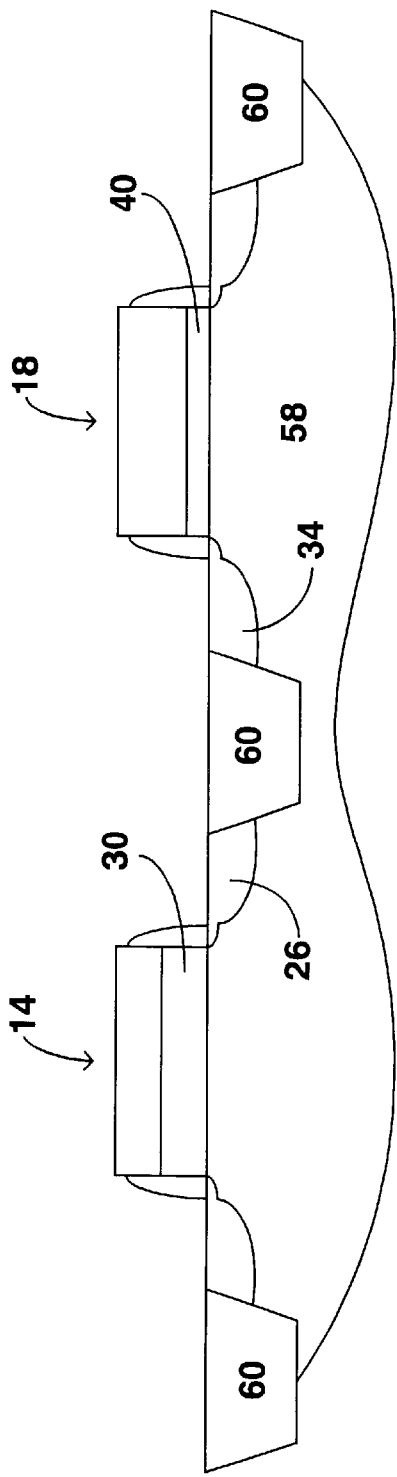
FIG. 2 is a cross sectional diagram of memory cell according to a first embodiment of the present invention.

FIG. 2 depicts a cross sectional view of a first embodiment of a portion of a memory cell 12. For the purposes of FIG. 2, it is immaterial whether the memory cell 12 is NMOS or PMOS. However, it is appreciated that the type of doping applied to each of the structures of the first pass gate transistor 14 and the first state node transistor 18 may vary according to the transistor technology type selected. FIG. 2 depicts the relatively thicker oxide in the gate 30 of the first pass gate transistor 14, and the relatively thinner, or normal thickness, of the oxide in the gate 40 of the first state node transistor 18.

FIG. 2 also depicts another benefit of the present invention. Because all of the transistors within a memory cell 12 can be of the same type, whether all NMOS or all PMOS, a complete isolation structure is not required between the different transistors. Thus, as depicted in FIG. 2, the well 58 extends between the first pass gate transistor 14 and the first state node transistor 18. In prior art technology, the wells for the two transistors could not be united, and the isolation oxide structure 60 would need to extend down through the wells 58 to the portion of the substrate below the wells 58.

Thus, the present invention allows the transistors to be closer together than what is possible with prior art technology, because the implanted well structures can overlap as depicted in FIG. 2, and all of the transistors for a single memory cell 12 can be within what is effectively a single common well structure. Further, in another embodiment all of the transistors of all of a plurality of memory cells for a memory circuit reside within a single well structure.

Figure 3:
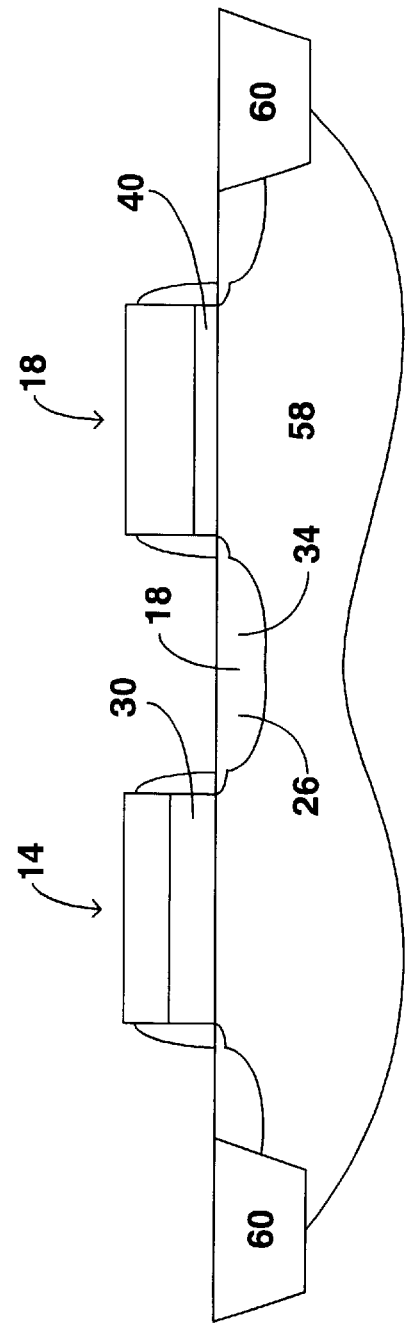
FIG. 3 is a cross sectional diagram of a memory cell according to a second embodiment the present invention.

FIG. 3 depicts a further embodiment where the oxide isolation structure 60 has also been removed, and the drain 26 of the first pass gate transistor 14 is a common structure with the source 34 of the first state node transistor 18. Thus, the first state node 28 exists within the common drain 26 and source 34 structure. This allows the transistors to be even closer together and saves additional space in the layout of the memory cell 12.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A memory cell, comprising:

a first bit line, a second bit line, a first state node, a second state node, a memory cell enable line, a ground line, a first pass gate transistor having a gate oxide with a first thickness, the first pass gate transistor having a source electrically connected to the first bit line, a drain electrically connected to the first state node, and a gate electrically connected to the memory cell enable line, a second pass gate transistor having a gate oxide with the first thickness, the a second pass gate transistor having a source electrically connected to the second bit line, a drain electrically connected to the second state node, and a gate electrically connected to the memory cell enable line, a first state node transistor having a gate oxide with a second thickness, wherein the first thickness is greater than the second thickness, the first state node transistor having a source electrically connected to the ground line, and a gate electrically connected to the second state node, and a second state node transistor having a gate oxide with the second thickness, the second state node transistor having a source electrically connected to the second state node, a drain electrically connected to the ground line, and a gate electrically connected to the first state node.

2. The memory cell of claim 1, wherein the first thickness is greater than the second thickness.

3. The memory cell of claim 1, wherein the first pass gate transistor, the second pass gate transistor, the first state node transistor, and the second state node transistor further comprise NMOS transistors.

4. The memory cell of claim 1, wherein the first pass gate transistor, the second pass gate transistor, the first state node transistor, and the second state node transistor further comprise PMOS transistors.

5. The memory cell of claim 1, further comprising a single well containing all of the first pass gate transistor, the second pass gate transistor, the first state node transistor, and the second state node transistor.

6. A memory cell, comprising:
   a first bit line,
   a second bit line,
   a first state node,
   a second state node,
   a memory cell enable line,
   a ground line,
   a first pass gate transistor having a gate oxide with a first thickness, the first pass gate transistor having a source electrically connected to the first bit line, a drain electrically connected to the first state node, and a gate electrically connected to the memory cell enable line,
   a second pass gate transistor having a gate oxide with the first thickness, the second pass gate transistor having a source electrically connected to the second bit line, a drain electrically connected to the second state node, and a gate electrically connected to the memory cell enable line,
   a first state node transistor having a gate oxide with a second thickness, the first state node transistor having a source electrically connected to the first state node, a drain electrically connected to the ground line, and a gate electrically connected to the second state node, and
   a second state node transistor having a gate oxide with the second thickness, the second state node transistor having a source electrically connected to the second state node, a drain electrically connected to the ground line, and a gate electrically connected to the first state node,
   wherein both the first pass gate transistor and the second pass gate transistor have leakage currents that are about one hundred times greater than leakage currents for both the first state node transistor and the second state node transistor.

7. The memory cell of claim 1, wherein the first thickness of the gate oxide for both the first pass gate transistor and the second pass gate transistor is about sixty angstroms.

8. The memory cell of claim 1, wherein both the first pass gate transistor and the second pass gate transistor have a channel length of about 0.24 microns and a width of about 0.3 microns.

9. A memory circuit, comprising:
   a plurality of first bit lines,
   a plurality of second bit lines,
   a plurality of memory cell enable lines,
   a plurality of ground lines, and
   a plurality of memory cells, each one of the plurality of memory cells having;
      a first pass gate transistor having a gate oxide with a first thickness, the first pass gate transistor having a source electrically connected to one of the plurality of first bit lines, a drain electrically connected to a first state node, and a gate electrically connected to one of the plurality of memory cell enable lines,
      a second pass gate transistor having a gate oxide with the first thickness, the second pass gate transistor having a source electrically connected to one of the plurality of second bit lines, a drain electrically connected to a second state node, and a gate electrically connected to the one of the plurality of memory cell enable lines,
      a first state node transistor having a gate oxide with a second thickness, wherein the first thickness is greater than the second thickness, the first state node transistor having a source electrically connected to the first state node, a drain electrically connected to one of the plurality of ground lines, and a gate electrically connected to the second state node, and
      a second state node transistor having a gate oxide with the second thickness, the second state node transistor having a source electrically connected to the second state node, a drain electrically connected to the one of the plurality of ground lines, and a gate electrically connected to the first state node.

10. The memory circuit of claim 9, wherein the first pass gate transistor, the second pass gate transistor, the first state node transistor, and the second state node transistor of each of the plurality of memory cells further comprise NMOS transistors.

11. The memory circuit of claim 9, wherein the first pass gate transistor, the second pass gate transistor, the first state node transistor, and the second state node transistor of each of the plurality of memory cells further comprise PMOS transistors.

12. The memory circuit of claim 9, further comprising a single well containing all of the first pass gate transistor, the second pass gate transistor, the first state node transistor, and the second state node transistor of each of the plurality of memory cells.

* * * * *